United States Patent
Arimoto et al.

(10) Patent No.: US 7,952,121 B2
(45) Date of Patent: May 31, 2011

(54) IMAGE SENSOR AND SENSOR UNIT

(75) Inventors: Mamoru Arimoto, Ogaki (JP); Hayato Nakashima, Anpachi-gun (JP); Kaori Misawa, Kaizu (JP); Ryu Shimizu, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 158 days.

(21) Appl. No.: 12/197,515

(22) Filed: Aug. 25, 2008

(65) Prior Publication Data

US 2009/0057724 A1    Mar. 5, 2009

(30) Foreign Application Priority Data

Aug. 28, 2007   (JP) ................. 2007-221497

(51) Int. Cl.
*H01L 31/00*    (2006.01)
(52) U.S. Cl. ........ 257/252; 257/236; 257/230; 257/246; 257/E31.001
(58) Field of Classification Search .................. 257/252, 257/236, 246, E31.001, 223, 225, 229, 230
See application file for complete search history.

(56) References Cited

U.S. PATENT DOCUMENTS

| 4,139,782 | A  | * | 2/1979  | Ablassmeier ................... 377/58 |
| 6,862,333 | B2 | * | 3/2005  | Kashima et al. ................ 377/60 |
| 2005/0270389 | A1 | * | 12/2005 | Wuori et al. .................. 348/294 |
| 2008/0048212 | A1 | * | 2/2008  | Nakashima et al. ............ 257/222 |

OTHER PUBLICATIONS

S.M. Sze, Physics of Semiconductor Devices ( May 1981 ) Jhon Wiley & Sons, chapter 7, p. 417.*
Yonemoto, "Basic and Application of CCD/CMOS Image Sensor," CQ Shuppan-sha, Aug. 10, 2003, pp. 189-191 and 204.

* cited by examiner

*Primary Examiner* — Thinh T Nguyen
(74) *Attorney, Agent, or Firm* — Ditthavong Mori & Steiner, P.C.

(57) ABSTRACT

An image sensor includes a charge storage portion for storing and transferring signal charges, a first electrode for forming an electric field storing the signal charges in the charge storage portion, a charge increasing portion for increasing the signal charges stored in the charge storage portion and a second electrode for forming another electric field increasing the signal charges in the charge increasing portion, wherein the quantity of the signal charges storable in the charge storage portion is not less than the quantity of the signal charges storable in the charge increasing portion.

14 Claims, 11 Drawing Sheets

IMAGE SENSOR AND SENSOR UNIT

CROSS-REFERENCE TO RELATED APPLICATIONS

The priority application number JP2007-221497, Image Sensor, Aug. 28, 2007, Mamoru Arimoto, Hayato Nakashima, Kaori Misawa, Ryu Shimizu, upon which this patent application is based is hereby incorporated by reference.

BACKGROUND OF THE INVENTION

1. Field of the Invention

The present invention relates to an image sensor and a sensor unit, and more particularly, it relates to an image sensor and a sensor unit each comprising an electrode for forming an electric field storing signal charges.

2. Description of the Background Art

An image sensor comprising an electrode for forming an electric field storing electrons (signal charges) is known in general.

A conventional general CMOS image sensor comprising a photodiode converting light incident by photoelectric conversion to electrons, an electrode for forming an electric field for storing converted electrons and a floating diffusion region for converting stored electrons to electric signals is disclosed in Basics and Applications of a CCD/CMOS Image Sensor (pp. 189-191) by Kazuya Yonemoto, CQ publishing, (published in Feb. 1, 2004).

SUMMARY OF THE INVENTION

An image sensor according to a first aspect of the present invention comprises a charge storage portion for storing and transferring signal charges, a first electrode for forming an electric field storing the signal charges in the charge storage portion, a charge increasing portion for increasing the signal charges stored in the charge storage portion and a second electrode for forming another electric field increasing the signal charges in the charge increasing portion, wherein the quantity of the signal charges storable in the charge storage portion is not less than the quantity of the signal charges storable in the charge increasing portion.

A sensor unit according to a second aspect of the present invention comprises a charge storage portion for storing and transferring signal charges, a first electrode for forming an electric field storing the signal charges in the charge storage portion, a charge increasing portion for increasing the signal charges stored in the charge storage portion and a second electrode for forming another electric field increasing the signal charges in the charge increasing portion, wherein the quantity of the signal charges storable in the charge storage portion is not less than the quantity of the signal charges storable in the charge increasing portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

The structure of a CMOS image sensor according to a first embodiment will be now described with reference to FIGS. 1 to 6. The first embodiment of the present invention is applied to an active CMOS image sensor employed as an exemplary image sensor.

Figure 1:
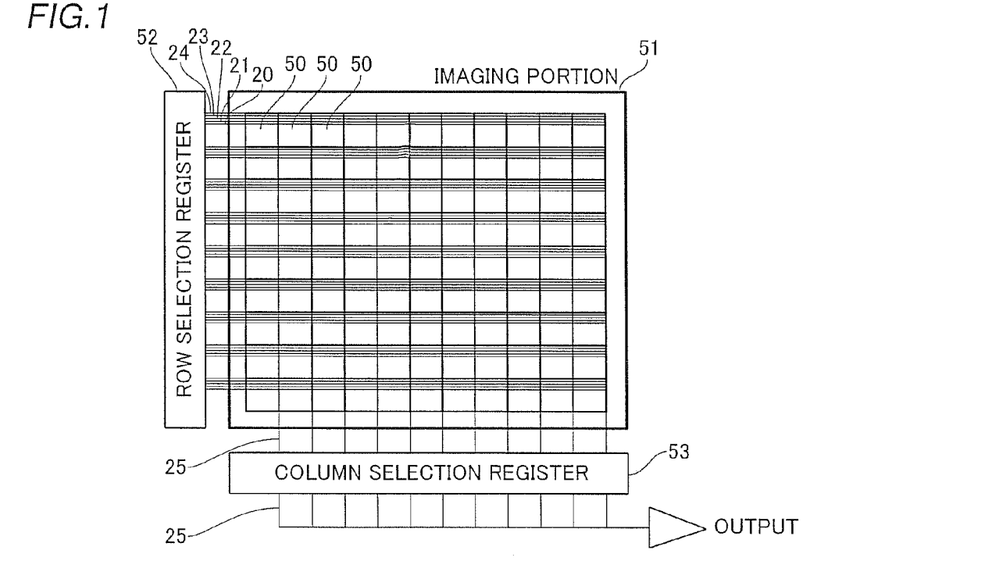
FIG. 1 is a plan view showing an overall structure of a CMOS image sensor according to a first embodiment of the present invention.

The CMOS image sensor according to the first embodiment comprises an imaging portion 51 including a plurality of pixels 50 arranged in the form of a matrix, a row selection register 52 and a column selection register 53, as shown in FIG. 1.

Figure 2:
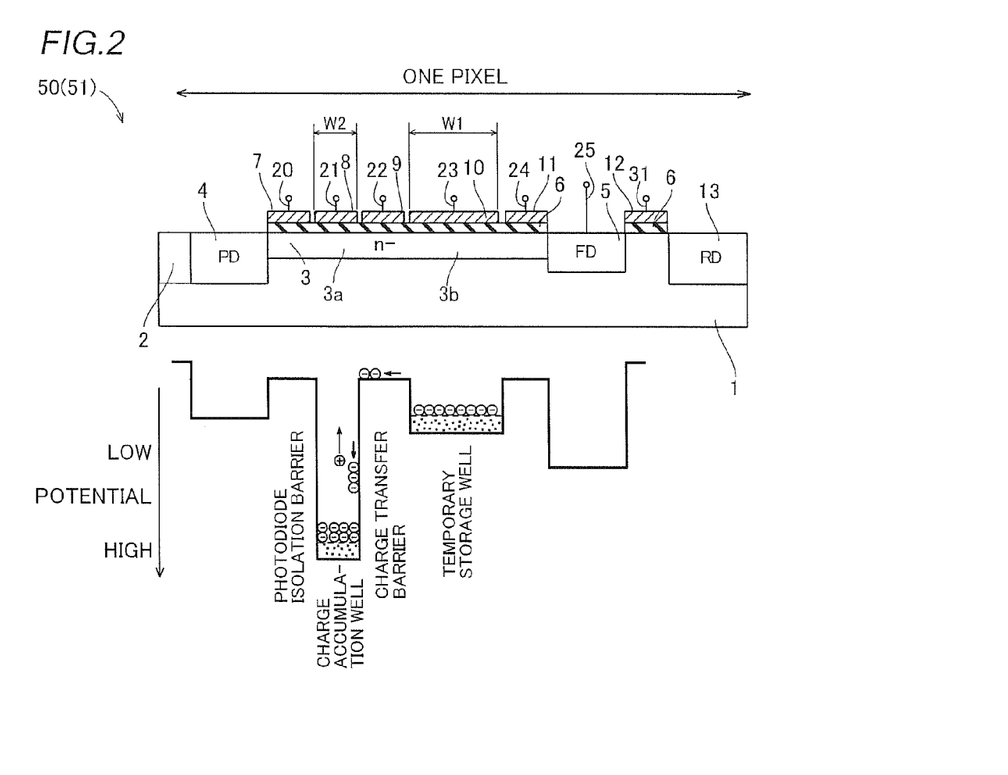
FIG. 2 is a sectional view in the CMOS image sensor according to the first embodiment.
Figure 3:
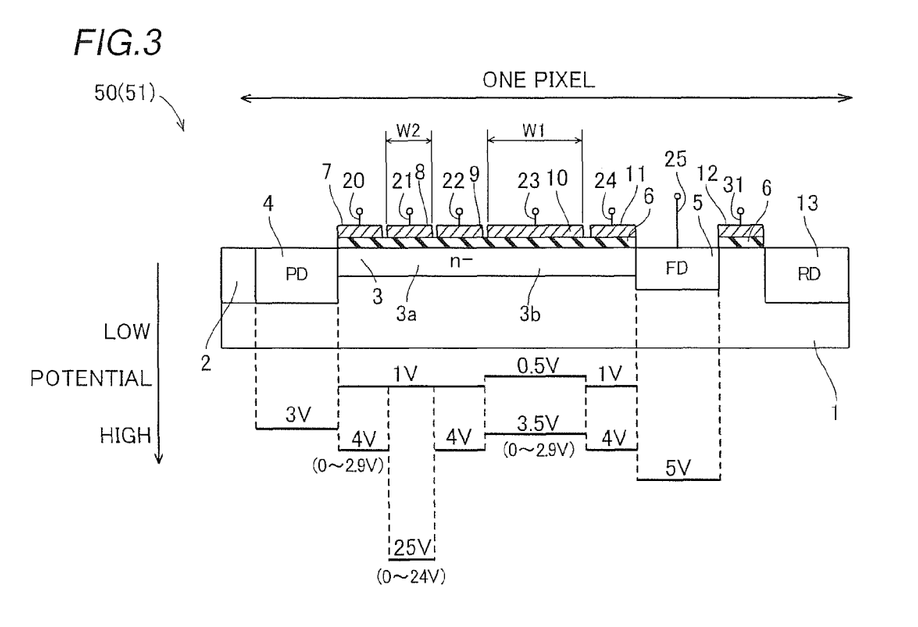
FIG. 3 is a potential diagram in the CMOS image sensor according to the first embodiment.

As to the sectional structure of the pixels 50 of the CMOS image sensor according to the first embodiment, element isolation regions 2 for isolating the pixels 50 from each other are formed on a surface of a p-type silicon substrate 1, as shown in FIGS. 2 and 3. On the surface of the p-type silicon substrate 1 provided with each pixel 50 enclosed with the corresponding element isolation regions 2, a photodiode (PD) portion 4 and a floating diffusion (FD) region 5 consisting of an n-type impurity region are formed at a prescribed interval, to hold a transfer channel 3 consisting of an n-type impurity region therebetween. The PD portion 4 and the FD region 5 are examples of the "photoelectric conversion portion" and the "voltage conversion portion" in the present invention respectively.

The PD portion 4 has a function of generating electrons in response to the quantity of incident light and storing the generated electrons. The PD portion 4 is formed to be adjacent to the corresponding element isolation region 2 as well as to the transfer channel 3. The FD region 5 has a function of holding signal charges formed by transferred electrons and converting the signal charges to a voltage. The FD region 5 is formed to be adjacent to the corresponding element isolation region 2 as well as to the transfer channel 3. Thus, the FD region 5 is formed to be opposed to the PD portion 4 through the transfer channel 3.

A gate insulating film 6 made of $SiO_2$ is formed on upper surfaces of the transfer channel 3. A transfer gate electrode 7, a multiplier gate electrode 8, a transfer gate electrode 9, a storage gate electrode 10 and a read gate electrode 11 are formed on the gate insulating film 6 in this order from the side of the PD portion 4 toward the side of the FD region 5. A reset gate electrode 12 is formed on a position holding the FD region 5 between the read gate electrode 11 and the reset gate electrode 12 through the gate insulating film 6 and a reset drain region 13 is formed on a position opposed to the FD region 5 with the reset gate electrode 12 therebetween. The electron multiplying portion 3a is provided in the transfer channel 3 under the multiplier gate electrode 8, and the electron storage portion 3b is provided in the transfer channel 3 under the storage gate electrode 10. The multiplier gate electrode 8, the storage gate electrode 10 and the read gate electrode 11 are examples of the "second electrode", the "first electrode" and the "third electrode" in the present invention respectively. The transfer gate electrode 7 and the transfer gate electrode 9 are examples of the "fifth electrode" and the "fourth electrode" in the present invention respectively. The electron multiplying portion 3a is an example of the "charge increasing portion" in the present invention, and the electron storage portion 3b is an example of the "charge storage portion" in the present invention.

The transfer gate electrode 7 is formed between the PD portion 4 and the multiplier gate electrode 8. The read gate electrode 11 is formed between the storage gate electrode 10 and the FD region 5. The read gate electrode 11 is formed to be adjacent to the FD region 5.

Figure 4:
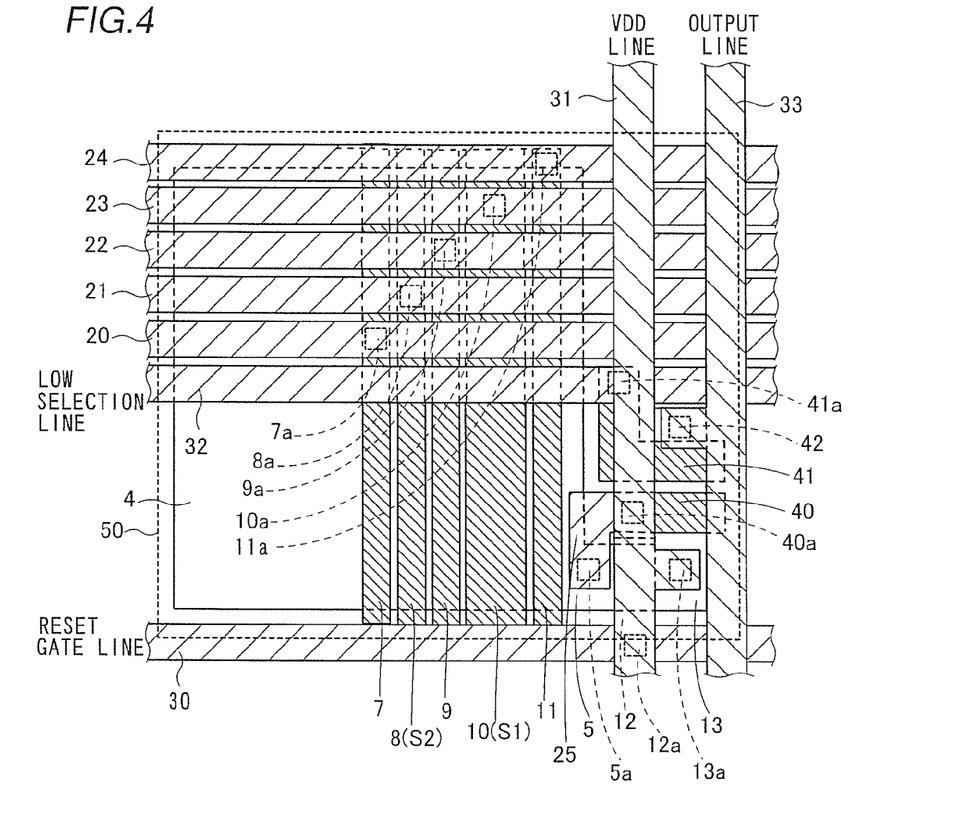
FIG. 4 is a plan view showing pixels in the CMOS image sensor according to the first embodiment.

According to the first embodiment, the width (W1 in FIG. 2) of the storage gate electrode 10 is larger than the width (W2 in FIG. 2) of the remaining gate electrodes other than the storage gate electrode 10 so that the plane area (S1 in FIG. 4) of the storage gate electrode 10 is larger than each of the plane areas (S2 in FIG. 4) of the remaining gate electrodes other than the storage gate electrode 10, as shown in FIG. 4.

According to the first embodiment, the quantity of charges (Q1) storable in the electron storage portion 3b under the storage gate electrode 10 in the state of supplying ON-state signals to the multiplier gate electrode 8 and the storage gate electrode 10 is larger than the quantity of charges (Q2) storable in the electron storage portion 3b under the multiplier gate electrode 8. More specifically, assuming that V1 represents a potential in an ON-state of the electron storage portion 3b and V2 represents a potential in an ON-state of the electron multiplying portion 3a, Q1 and Q2 are expressed as follows by plugging into Q=CV and C=∈S/d respectively:

$Q1 = \in S1 V1/d$, and $Q2 = \in S2 V2/d$

At this time, the relation between V1 and V2 is V1 (about 3.5 V)<V2 (about 25 V) described later. Therefore, the size of the plane area S1 of the storage gate electrode 10 is so controlled as to satisfy $\in S1V1/d (=Q1) \geqq \in S2V2/d$ ($=Q2$). ∈ represents the dielectric constant of the gate insulating film 6, and d represents the thickness of the gate insulating film 6. The voltage V1 and the voltage V2 are examples of the "first voltage" and the "second voltage" in the present invention respectively.

As shown in FIG. 4, wiring layers 20, 21, 22, 23 and 24 supplying clock signals φ1, φ2, φ3, φ4 and φ5 for voltage control are electrically connected to the transfer gate electrode 7, the multiplier gate electrode 8, the transfer gate electrode 9, the storage gate electrode 10 and the read gate electrode 11 through contact portions 7a, 8a, 9a, 10a and 11a respectively. The wiring layers 20, 21, 22, 23 and 24 are formed every row, and electrically connected to the transfer gate electrode 7, the multiplier gate electrode 8, the transfer gate electrode 9, the storage gate electrode 10 and the read gate electrode 11 of the plurality of pixels 50 forming each row respectively. A signal line 25 for extracting a signal through a contact portion 5a is electrically connected to the FD region 5.

When ON-state (high-level) clock signals φ1, φ3 and φ5 are supplied to the transfer gate electrodes 7 and 9 and the read gate electrode 11 through the wiring layers 20, 22 and 24 respectively, voltages of about 2.9 V are applied to the transfer gate electrodes 7 and 9 and the read gate electrode 11, as shown in FIG. 3. Thus, portions of the transfer channel 3 located under the transfer gate electrodes 7 and 9 and the read gate electrode 11 respectively are controlled to potentials of about 4 V when the ON-state (high-level) clock signals φ1, φ3 and φ5 are supplied to the transfer gate electrodes 7 and 9 and the read gate electrode 11 respectively.

When an ON-state (high-level) clock signal φ2 is supplied to the multiplier gate electrode 8 through the wiring layer 21, a voltage of about 24 V is applied to the multiplier gate electrode 8. Thus, the portion of the transfer channel 3 located under the multiplier gate electrode 8 is controlled to a high potential of about 25 V when the ON-state (high-level) clock signal φ2 is supplied to the multiplier gate electrode 8.

According to the first embodiment, when an ON-state (high-level) clock signal φ4 is supplied to the storage gate electrode 10 through the wiring layer 23, the potential of the portion of the transfer channel 3 located under the storage gate electrode 10 (electron storage portion 3b) is a potential of about 3.5 V. In other words, when the ON-state signal is supplied, the potentials (about 4V) in the ON-state of the portions of the transfer channel 3 corresponding to the transfer gate electrode 9 and the read gate electrode 11 adjacent to the storage gate electrode 10 are higher than the potential of the portion of the transfer channel 3 (about 3.5 V) located under the storage gate electrode 10, whereby the potential of the portion of the transfer channel 3 located under the storage gate electrode 10 is controlled to be higher than the potential of the portion of the transfer channel 3 located under the read gate electrode 11. According to the first embodiment, a voltage of about 2.9 V is applied to the storage gate electrode 10 so that the potential of the portion of the transfer channel 3 located under the storage gate electrode 10 (electron storage portion 3b) is set to about 3.5 V. At this time, the impurity concentration of the portion of the transfer channel 3 located under the storage gate electrode 10 is smaller than the impurity concentration of the portions of the transfer channel 3 located under the remaining gate electrodes other than the storage gate electrode 10, whereby the potentials (about 3.5 V) of the transfer channel 3 located under the storage gate electrode 10 is smaller than the potential (about 4V) of the portions of the transfer channel 3 located under the remaining gate electrodes other than the storage gate electrode 10, when voltages of about 2.9 V are applied to the remaining gate electrodes.

When OFF-state (low-level) clock signals φ1, φ2, φ3, φ4 and φ5 are supplied to the transfer gate electrode 7, the multiplier gate electrode 8, the transfer gate electrode 9, the storage gate electrode 10 and the read gate electrode 11 respectively, voltages of about 0 V are applied to the transfer gate electrode 7, the multiplier gate electrode 8, the transfer gate electrode 9 and the storage gate electrode 10 and the read gate electrode 11. Thus, the portions of the transfer channel 3 located under the transfer gate electrode 7, the multiplier gate electrode 8, the transfer gate electrode 9 and the read gate electrode 11 are controlled to potentials of about 1 V. The potential of the portion of the transfer channel 3 located under the storage gate electrode 10 is controlled to a potential of about 0.5 V. The FD region 5 is controlled to a potential of about 5 V. The reset drain region 13 is controlled to a potential of about 5 V and has a function as an ejecting portion of electrons held in the FD region 5.

The transfer gate electrode 7 has a function of transferring electrons generated by the PD portion 4 to the electron multiplying portion 3a located on the portion of the transfer channel 3 located under the multiplier gate electrode 8 through the portion of the transfer channel 3 located under the transfer gate electrode 7 by supplying the ON-state signal to the transfer gate electrode 7.

When the electrons stored in the PD portion 4 are multiplied, a high electric field is applied to the electron multiplying portion 3a located on the portion of the transfer channel 3 located under the multiplier gate electrode 8 by supplying the ON-state signal to the multiplier gate electrode 8. Then the speed of the electrons transferred from the PD portion 4 is increased by the high electric field generated in the electron multiplying portion 3a and the electrons transferred from the PD portion 4 are multiplied by impact ionization with atoms in the impurity region. The impact ionization of the electrons is caused on the boundary between portion of the transfer channel 3 located under the multiplier gate electrode 8 (electron multiplying portion 3a) and the portion of the transfer channel 3 located under the transfer gate electrode 9.

The portion of the transfer channel 3 located under the transfer gate electrode 7 has a function as an isolation barrier dividing the PD portion 4 and portion of the transfer channel 3 located under the multiplier gate electrode 8 (electron multiplying portion 3a) from each other when the OFF-state (low-level) clock signal φ1 is supplied to the transfer gate electrode 7. The transfer gate electrode 9 has a function of transferring the electrons between the portion of the transfer channel 3 located under the multiplier gate electrode 8 (electron multiplying portion 3a) and the electron storage portion 3b provided on the portion of the transfer channel 3 located under the storage gate electrode 10 when the ON-state signal is supplied. When the OFF-state signal is supplied to the transfer gate electrode 9, on the other hand, the transfer gate electrode 9 functions as a charge transfer barrier for suppressing transfer of the electrons between the electron multiplying portion 3a located under the multiplier gate electrode 8 and the electron storage portion 3b located under the storage gate electrode 10.

The portion of the transfer channel 3 located under the read gate electrode 11 has a function of transferring the electrons stored in the portion of the transfer channel 3 located under the storage gate electrode 10 (electron storage portion 3b) to the FD region 5 when the ON-state (high-level) signal is supplied to the read gate electrode 11, and a function of dividing the portion of the transfer channel 3 located under the storage gate electrode 10 (electron storage portion 3b) and the FD region 5 from each other when the OFF-state (low-level) signal is supplied to the read gate electrode 11.

Figure 5:
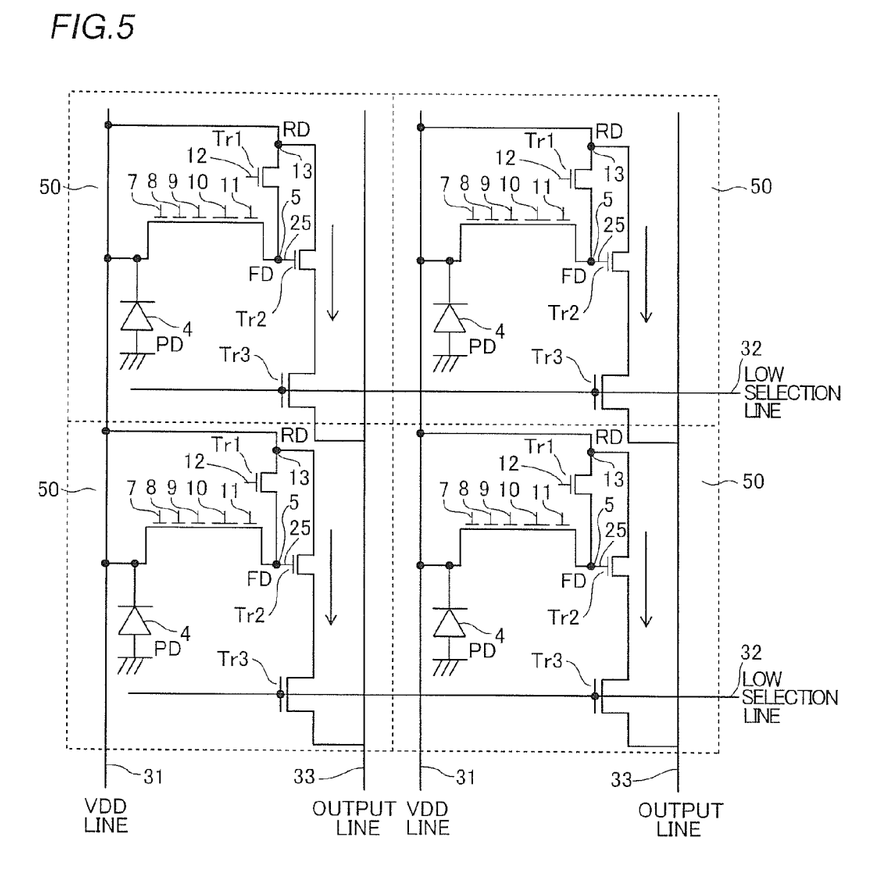
FIG. 5 is a circuit diagram showing the circuit structure of the CMOS image sensor according to the first embodiment.

As shown in FIGS. 4 and 5, each pixel 50 includes a reset transistor Tr1 having the transfer gate electrode 7, the multiplier gate electrode 8, the transfer gate electrode 9, the storage gate electrode 10, the read gate electrode 11 and the reset gate electrode 12, an amplification transistor Tr2 and a pixel selection transistor Tr3. A reset gate line 30 is connected to the reset gate electrode 12 of the reset transistor Tr1 through a contact portion 12a, to supply a reset signal. The drain (reset drain 13) of the reset transistor Tr1 is connected to a power supply potential (VDD) line 31 through a contact portion 13a. The FD region 5 constituting a source of the reset transistor Tr1 and a drain of the read gate electrode 11 and a gate 40 of the amplification transistor Tr2 are connected with each other by the signal line 25 through the contact portions 5a and 40a. A source of the pixel selection transistor Tr3 is connected to a drain of the amplification transistor Tr2. The pixel selection transistor Tr3 has a gate 41 connected to a row selection line 32 through a contact portion 41a and a source connected to an output line 33 through a contact portion 42.

The CMOS image sensor according to the first embodiment is so formed as to reduce the number of wires and the number of transistors for decoding by the aforementioned circuit structure. Thus, the overall CMOS image sensor can be downsized. In this circuit structure, the read gate electrode 11 is on-off controlled every row, while the remaining gate electrodes other than the read gate electrode 11 are simultaneously on-off controlled with respect to the overall pixels 50.

An electron transferring operation and an electron multiplying operation of the CMOS image sensor according to the first embodiment will be now described with reference to FIGS. 6 to 9.

When light is incident upon the PD portion 4, the electrons are generated in PD portion 4 by photoelectric conversion. In a period A shown in FIGS. 6 and 7, a voltage of about 2.9 is applied to the transfer gate electrode 7 after a voltage of about 24 V is applied to the multiplier gate electrode 8. Thus, the potential of the portion of the transfer channel 3 located under the transfer gate electrode 7 is controlled to a potential of about 4 in the state where the potential of the portion of the transfer channel 3 located under the multiplier gate electrode 8 is controlled to a potential of about 25 V. At this time, electrons generated by the PD portion 4 (about 3 V) are transferred to the portion of the transfer channel 3 located under the multiplier gate electrode 8 (electron multiplying portion 3a) (higher potential of about 25 V) through the portion of the transfer channel 3 located under the transfer gate electrode 7 (about 4V).

Figure 6:
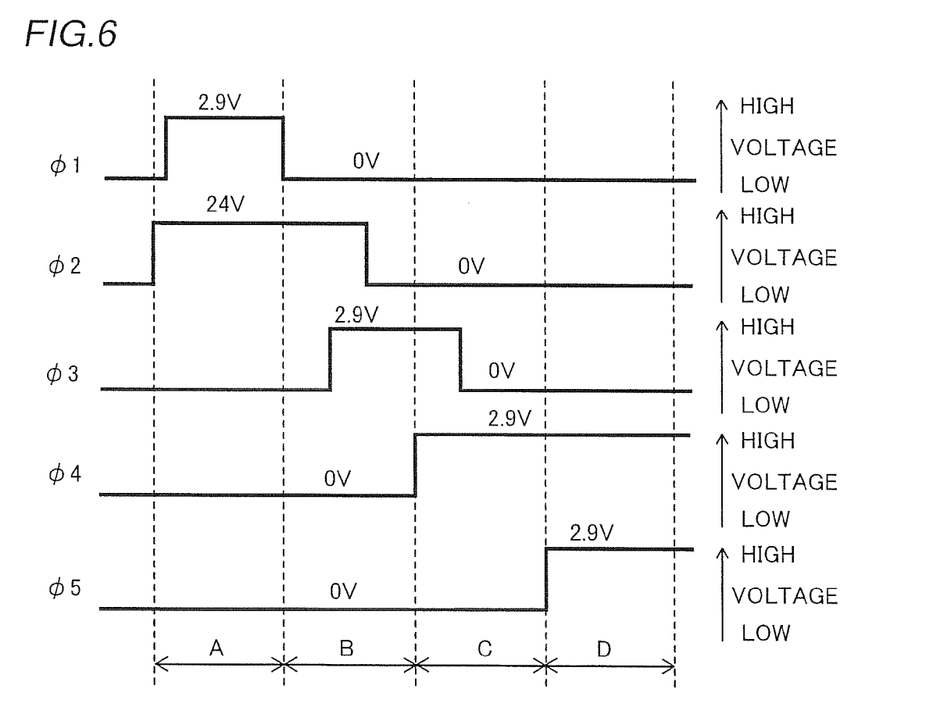
FIG. 6 is a signal waveform diagram for illustrating an electron transferring operation in the CMOS image sensor according to the first embodiment.
Figure 7:
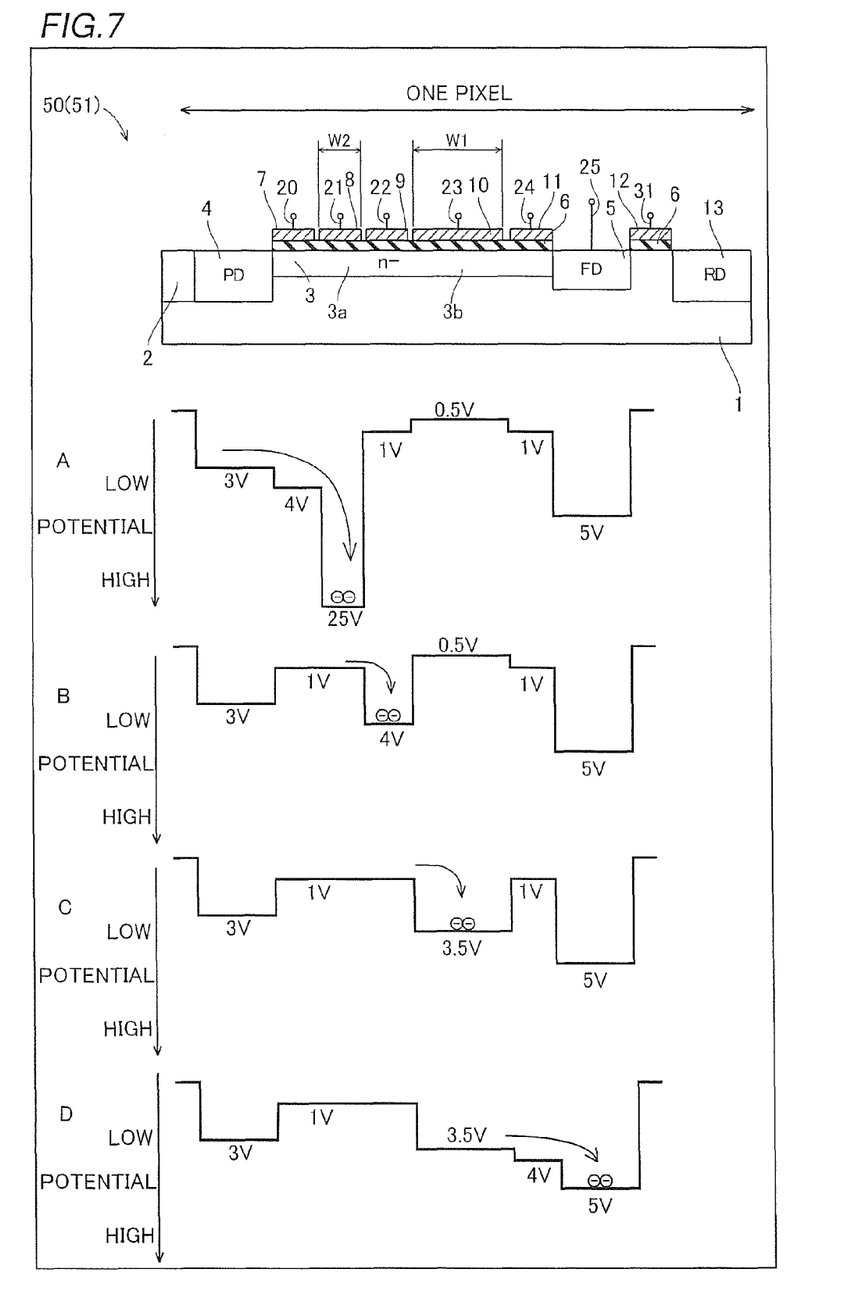
FIG. 7 is a potential diagram for illustrating the electron transferring operation of the CMOS image sensor according to the first embodiment.

In a period B, a voltage of about 2.9 V is applied to the transfer gate electrode 9 and a voltage of about 0 V is thereafter applied to the multiplier gate electrode 8. Thus, electrons are transferred from the electron multiplying portion 3a (about 1 V) under the multiplier gate electrode 8 to the portion of the transfer channel 3 located under the transfer gate electrode 9 (higher potential of about 4V). In a period C, a voltage of about 2.9 is applied to the storage gate electrode 10 and a voltage of about 0 V is thereafter applied to the transfer gate electrode 9. Thus, the electrons are transferred from the portion of the transfer channel 3 located under the transfer gate electrode 9 to the portion of the transfer channel 3 located under the storage gate electrode 10 (electron storage portion 3b) (higher potential of about 3.5 V).

In a period D, a voltage of about 2.9 V is applied to the read gate electrode 11, to control the potential of the portion of the transfer channel 3 located under the read gate electrode 11 to a potential of about 4 V. According to the first embodiment, the storage gate electrode 10 is maintained in the state where a voltage of about 2.9 V is applied. At this time, the portion of the transfer channel 3 located under the storage gate electrode 10 (electron storage portion 3*b*) is controlled to a potential of about 3.5 V, and hence electrons are transferred to the FD region 5 controlled to a higher potential through the portion of the transfer channel 3 located under the read gate electrode 11 (about 4V). Thus, the electron transferring operation is completed.

Figure 8:
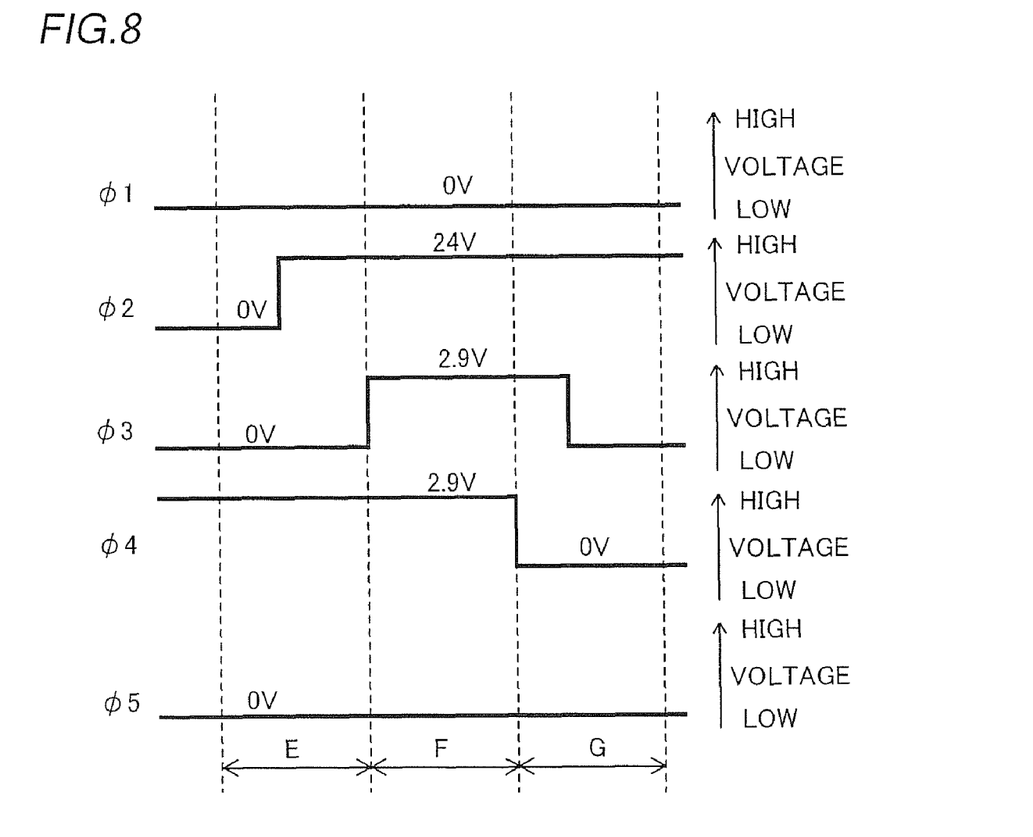
FIG. 8 is a signal waveform diagram for illustrating an electron multiplying operation of the CMOS image sensor according to the first embodiment.
Figure 9:
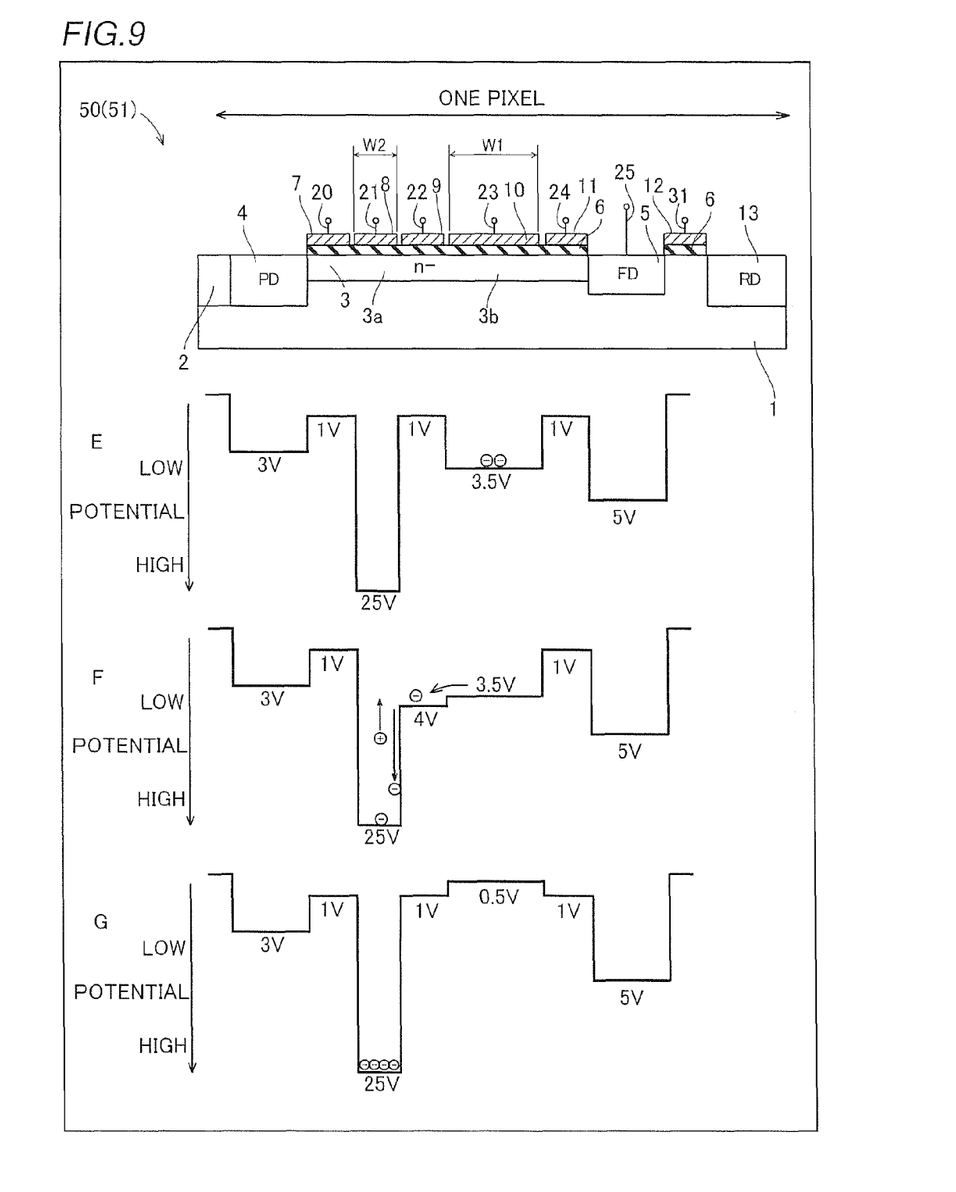
FIG. 9 is a potential diagram for illustrating the electron multiplying operation in the CMOS image sensor according to the first embodiment.

In the electron multiplying operation, the operations of the periods A to C in FIGS. 6 and 7 are performed, to bring the multiplier gate electrode 8 into an ON-state in a period E shown in FIGS. 8 and 9 and bring the transfer gate electrode 9 into an ON-state in a period F, in the state where the portion of the transfer channel 3 located under the storage gate electrode 10 (electron storage portion 3*b*) store electrons. Thus, the portion of the transfer channel 3 located under the multiplier gate electrode 8 (electron multiplying portion 3*a*) is controlled to a potential of about 25 V and the portion of the transfer channel 3 located under the transfer gate electrode 9 is thereafter controlled to a potential of about 4 V. At this time, the storage gate electrode 10 is maintained in an ON-state, and hence electrons stored in the portion of the transfer channel 3 located under the storage gate electrode 10 (electron storage portion 3*b*) are transferred to the portion of the transfer channel 3 located under the multiplier gate electrode 8 (electron multiplying portion 3*a*) (higher potential of about 25 V) through the portion of the transfer channel 3 located under the transfer gate electrode 9 (about 4V). Thus, in the electron transferring operation and the electron multiplying operation according to the first embodiment, also when electrons stored in the portion of the transfer channel 3 located under the storage gate electrode 10 (electron storage portion 3*b*) are transferred, the ON-state signal is supplied to the storage gate electrode 10. The electrons are transferred to the electron storage portion 3*a* to be multiplied in the aforementioned manner. The transfer gate electrode 9 is brought into an OFF-state in a period G, thereby completing the electron multiplying operation. The aforementioned periods A to C and the periods E to G (electron transferring operation between the electron multiplying portion 3*a* and the electron storage portion 3*b*) is controlled to be performed a plurality of times (about 400 times, for example), whereby the electrons transferred from the PD portion 4 are multiplied to about 2000 times. A charge signal by thus multiplied and stored electrons is read as a voltage signal through the FD region 5 and the signal line 25 by the aforementioned read operation.

According to the first embodiment, as hereinabove described, the CMOS image sensor comprises the multiplier gate electrode 8 for forming an electric field performing the electron multiplying operation, the electron multiplying portion 3*a* where the electron multiplying operation is performed, the storage gate electrode 10 for forming the electric field storing in electrons and the electron storage portion 3*b* for storing electrons, and the quantity of electrons storable in the electron storage portion 3*b* under the storage gate electrode 10 ($\in$S1V1/d) is not less than the quantity of electrons storable in the electron multiplying portion 3*a* under the multiplier gate electrode 8 ($\in$S2V2/d), whereby all of the multiplied electrons can be held also the case where the electron multiplying operation is performed in the CMOS image sensor when incident light is low level illuminance. Therefore electrons can be multiplied when the incident light is low level illuminance, and all of the multiplied electrons (signal charges) can be held in the electron storage portion 3*b* and hence increase in noise caused in the CMOS image sensor can be suppressed.

According to the aforementioned first embodiment, the plane area (S1) of the storage gate electrode 10 is larger than each of the plane areas (S2) of the remaining gate electrodes other than the storage gate electrode 10, whereby the quantity of electrons storable in the electron storage portion 3*b* under the storage gate electrode 10 ($\in$S1V1/d) can be larger than the quantity of electrons storable in the portions of the transfer channel 3 located under the remaining electrodes other than the storage gate electrode 10 ($\in$S2V2/d). Thus, the quantity of electrons storable in the electron storage portion 3*b* under the storage gate electrode 10 can be larger than the quantity of electrons storable in the electron multiplying portion 3*a* under the multiplier gate electrode 8 by controlling the size of the plane area (S1) of the storage gate electrode 10, even when the voltage (V1) applied to the storage gate electrode 10 is smaller than the voltage (V2) applied to the multiplier gate electrode 8. Consequently, the quantity of electrons storable in the electron storage portion 3*b* can be controlled to be larger than the quantity of electrons storable in the portions of the transfer channel 3 located under the remaining electrodes and hence the electrons can be reliably held.

According to the aforementioned first embodiment, the potential of the portion of the transfer channel 3 located under the read gate electrode 11 (about 4V) is larger than the potential of the portion of the transfer channel 3 located under the storage gate electrode 10 (electron storage portion 3*b*) (about 3.5 V) when the ON-state voltages are applied to the storage gate electrode 10 and the read gate electrode 11, whereby electrons moves to a region with the higher voltage and hence electrons stored in the electron storage portion 3*b* can be easily transferred to the FD region 5 (about 5V). Further, electrons can be transferred to the FD region 5 in the state of supplying the ON-state signal to the storage gate electrode 10.

According to the aforementioned first embodiment, the ON-state signal is supplied to the read gate electrode 11 in the state of supplying the ON-state signal to the storage gate electrode 10 when the electrons stored in the portion of the transfer channel 3 located under the storage gate electrode 10 (electron storage portion 3*b*) are transferred to the FD region 5 through the portion of the transfer channel 3 located under the read gate electrode 11, whereby electrons can be transferred to the FD region 5 while maintaining the potential of the electron storage portion 3*b* into the ON-state and bringing the portion of the transfer channel 3 located under the read gate electrode 11 into the ON-state. Therefore, the read operation of electrons can be performed while maintaining the storage gate electrode 10 in the ON-state. Thus, in performing the read operation of the selected pixel 50, since the storage gate electrodes 10 of the pixels 50 other than the selected pixels 50 are brought into the OFF-state while the read gate electrodes 11 of the pixels 50 other than the selected pixels 50 are not brought into the ON-state when the storage gate electrode 10 is brought into the OFF-state and the read gate electrode 11 is brought into the ON-state, electrons included in the electron storage portions 3*b* of the pixels 50 other than the selected pixels 50 can be inhibited from overflow.

According to the aforementioned first embodiment, the ON-state voltage of the electron multiplying portion 8*a* (about 25 V) is larger than the ON-state voltage of the electron storage portion 10*b* (about 3.5 V), while the quantity of charges storable in the electron storage portion 10*b* can be easily larger than the quantity of charges storable in the electron multiplying portion 10*a* by controlling the plane area S1 of the storage gate electrode 10 and the plane area S2 of the multiplier gate electrode 8.

According to the aforementioned first embodiment, the impurity concentration of the portion of the transfer channel 3 located under the storage gate electrode 10 (electron storage portion 3*b*) is smaller than the impurity concentration of the portions of the transfer channel 3 located under the gate electrodes other than the storage gate electrode 10, whereby the potential of the electron storage portion 10b can be maintained to be lower than the region other than the electron storage portion 10b in the transfer channel 3 when applying a voltage to the electron storage portion 10b. Therefore, in reading electrons to the FD region 5, the potential of the portion of the transfer channel 3 located under the read gate electrode 11 can be maintained to be lower than the potential of the electron storage portion 3b even when the storage gate electrode 10 is in an ON-state, and hence electrons can be reliably transferred to the FD region 5.

According to the aforementioned first embodiment, in electron multiplying operation, the transfer gate electrode 9 is brought into the ON-state in the state of applying the high voltage to the electron multiplying portion 3a, and electrons are controlled to be transferred from the electron storage portion 3b to the electron multiplying portion 3a, whereby all of the electrons can be reliably transferred to the electron multiplying portion 3a as compared with the case where the electrons stored in the electron storage portion 3b are temporarily held in the portion of the transfer channel 3 located under the transfer gate electrode 9 and the multiplier gate electrode 8 is thereafter brought into an ON-state and transfers to the electron multiplying portion 3a.

Second Embodiment

Figure 10:
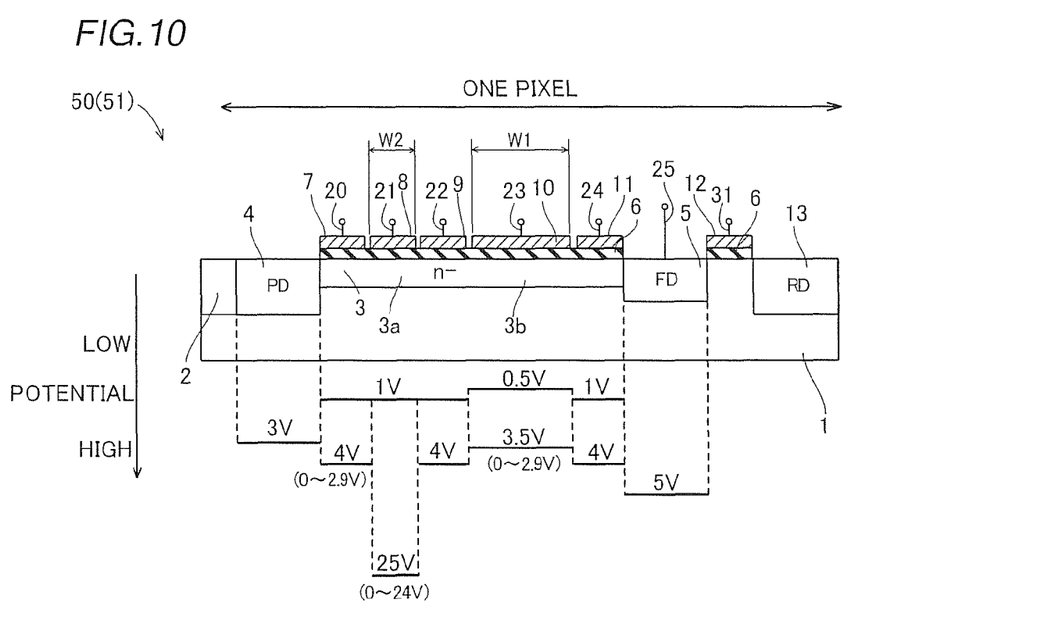
FIG. 10 is a potential diagram in a CMOS image sensor according to a second embodiment.
Figure 11:
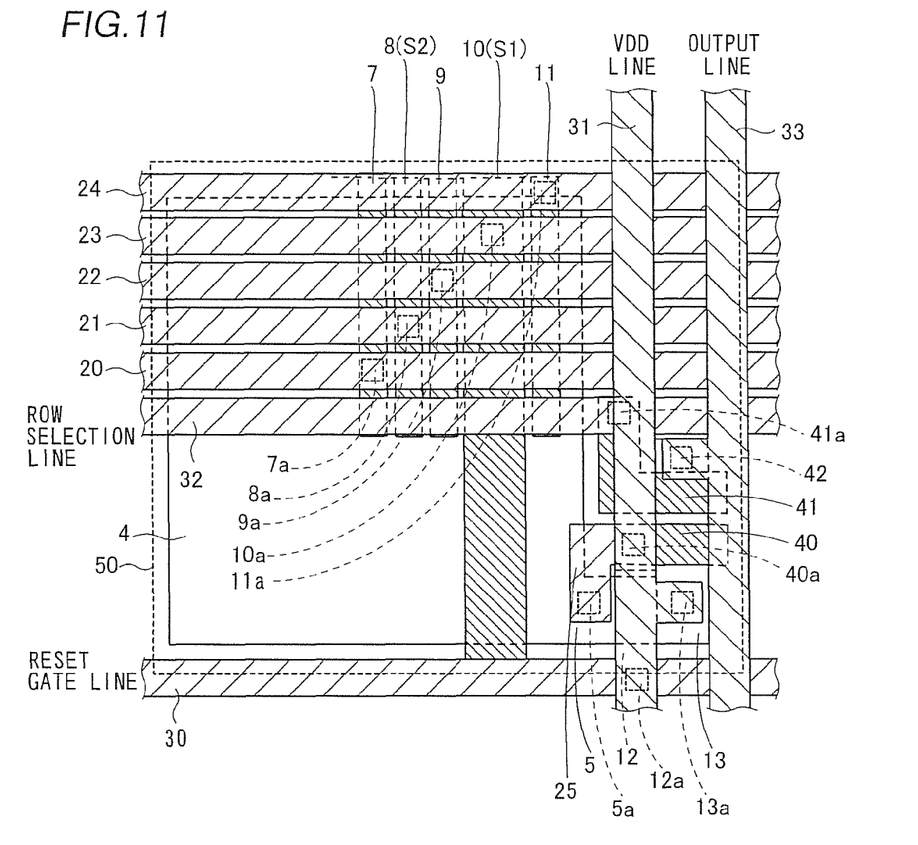
FIG. 11 is a plan view showing pixels in the CMOS image sensor according to the second embodiment.

Referring to FIGS. 10 and 11, a CMOS image sensor according to a second embodiment is so formed that each the plane areas of remaining electrodes other than a storage gate electrode 10 are reduced and the plane area of a PD portion 4 is increased in the structure of the CMOS image sensor according to the aforementioned first embodiment.

The CMOS image sensor according to the second embodiment of the present invention is so formed that the plane area (S1) of the storage gate electrode 10 is larger than each of the plane areas (S2) of the remaining electrodes other than the storage gate electrode 10 similarly to the aforementioned first embodiment, as shown in FIGS. 10 and 11. The plane areas (S2) of the remaining electrodes other than the storage gate electrode 10 are reduced and the plane area of the PD portion 4 is increased. Thus, a light utilization ratio can be increased due to the increased plane area of the PD portion 4 and electrons multiplied in the electron multiplying portion 3a can be reliably held in the electron storage portion 3b. Therefore, the photosensitivity of the CMOS image sensor can be improved. The remaining structure, operations, and effects of the second embodiment are similar to those of the first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned first and second embodiments is applied to the active CMOS image sensor amplifying signal charges in each pixel 50 as an exemplary image sensor, the present invention is not restricted to this but is also applicable to a passive CMOS image sensor not amplifying signal charges in each pixel.

While the portions of the transfer channel 3 located under the transfer gate electrodes 7 and 9 and the read gate electrode 11 respectively are controlled to the potentials of about 4 V when the transfer gate electrodes 7 and 9 and the read gate electrode 11 are in ON states in each of the aforementioned first and second embodiments, the present invention is not restricted to this but the portions of the transfer channel 3 located under the transfer gate electrodes 7 and 9 and the read gate electrode 11 respectively may alternatively be controlled to different potentials when the transfer gate electrodes 7 and 9 and the read gate electrode 11 are in ON states. In this case, the potential in an ON-state of the portion of the transfer channel 3 located under the read gate electrode 11 must be controlled to be higher than the potential in an ON-state of the portion of the transfer channel 3 located under the storage gate electrode 10.

While the transfer channel 3, the PD portion 4 and the FD region 5 are formed on the surface of the p-type silicon substrate 1 in each of the aforementioned first and second embodiments, the present invention is not restricted to this but a p-type well region may alternatively be formed on the surface of an n-type silicon substrate for forming a transfer channel 3, a PD portion 4 and a FD region 5 on the surface of the p-type well region.

While the electrons are employed as the signal charges in each of the aforementioned first and second embodiments, the present invention is not restricted to this but holes may alternatively be employed as the signal charges by entirely reversing the conductivity type of the substrate impurity and the polarities of the applied voltages.

While the electron storing capacity of the electron storage portion is increased by controlling the size of the plane area (S1) of the storage gate electrode 10 in each of the aforementioned first and second embodiments, the present invention is not restricted to this but the material of the gate insulating film 6 may be changed for changing the dielectric constant∈SO that the storable capacity of electrons is increased. In this case, for example, the material of the gate insulating film 6 may be changed from $SiO_2$ to SiN. Alternatively, the gate insulating film 6 may have a two-layer structure of $SiO_2$ and SiN. Alternatively, the thickness of the gate insulating film 6 may be changed so that the storable capacity of electrons is controlled.

While the impurity concentration of the gate insulating film 6 under the storage gate electrode 10 is smaller than the impurity concentration of the gate insulating film 6 under the remaining gate electrodes other than the storage gate electrode 10 so that the potential of the portion of the transfer channel 3 located under the read gate electrode 11 is larger than the potential of the portion of the transfer channel 3 located under the storage gate electrode 10 when the ON-state signals are supplied to the storage gate electrode 10 and the read gate electrode 11 respectively in each of the aforementioned first and second embodiments, the present invention is not restricted to this but the voltage applied to the storage gate electrode 10 may be alternatively changed so that the potential of the portion of the transfer channel 3 located under the storage gate electrode 10 is smaller than the potential of the portions of the transfer channel 3 located under the gate electrodes other than the storage gate electrode 10. In this case, an ON-state voltage of about 2.5 V is applied so that the portion of the transfer channel 3 located under the storage gate electrode 10 is set to about 3.5 V, and an OFF-state voltage of about −2 V is applied so that the portion of the transfer channel 3 located under the storage gate electrode 10 is set to a voltage of about 0.5 V.

Figure 12:
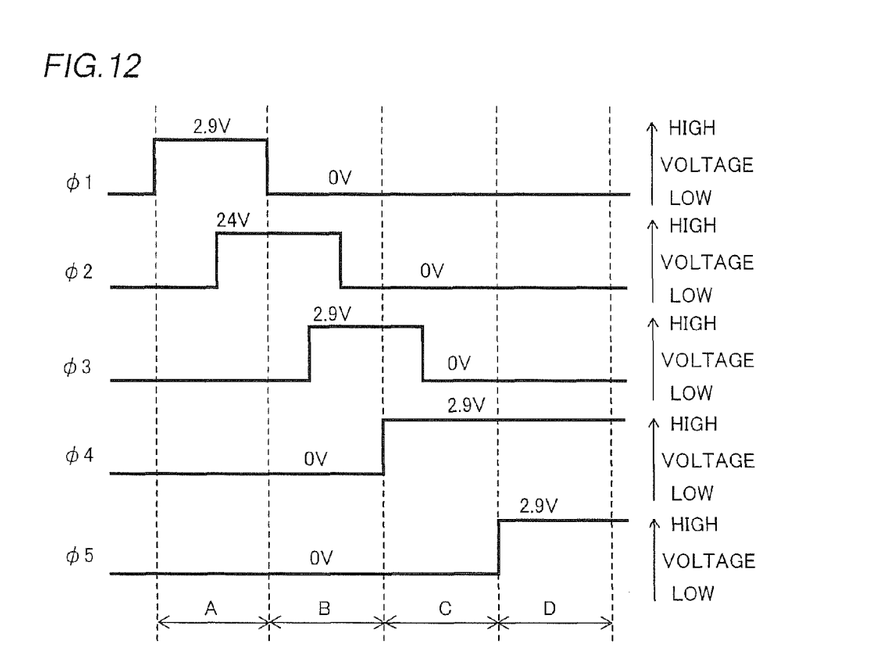
FIG. 12 is a signal waveform diagram for illustrating a modification of an electron transferring operation in the CMOS image sensor according to the first and second embodiments.

While the ON-state voltage is applied to the portion of the transfer channel 3 located under the multiplier gate electrode 8 (electron multiplying portion 3a) and the ON-state voltage is applied to the transfer gate electrode 7 to transfer the electrons, when the electrons are transferred from the PD portion 4 in each of the aforementioned first and second embodiments, the present invention is not restricted to this but an ON-state voltages may be applied to the electrodes successively from the transfer gate electrode 7 for transferring electrons when the electrons are transferred from the PD portion 4. More specifically, the electrons are transferred from the PD portion 4 to the portion of the transfer channel 3 located under the transfer gate electrode 7 by applying the ON-state voltage to the gate electrode 7 in the period A as shown in FIG. 12. Thereafter an ON-state voltage is applied to the multiplier gate electrode 8 and an OFF-voltage is thereafter applied to the transfer gate electrode 7, to transfer the electrons from the portion of the transfer channel 3 located under the transfer gate electrode 7 to the portion of the transfer channel 3 located under the multiplier gate electrode 8. Thereafter the electrons are controlled to be transferred to the portions of the transfer channel 3 located under the transfer gate electrode 9, the storage gate electrode 10 and the read gate electrode 11 through a transfer operation similar to that of the first embodiment.

Figure 13:
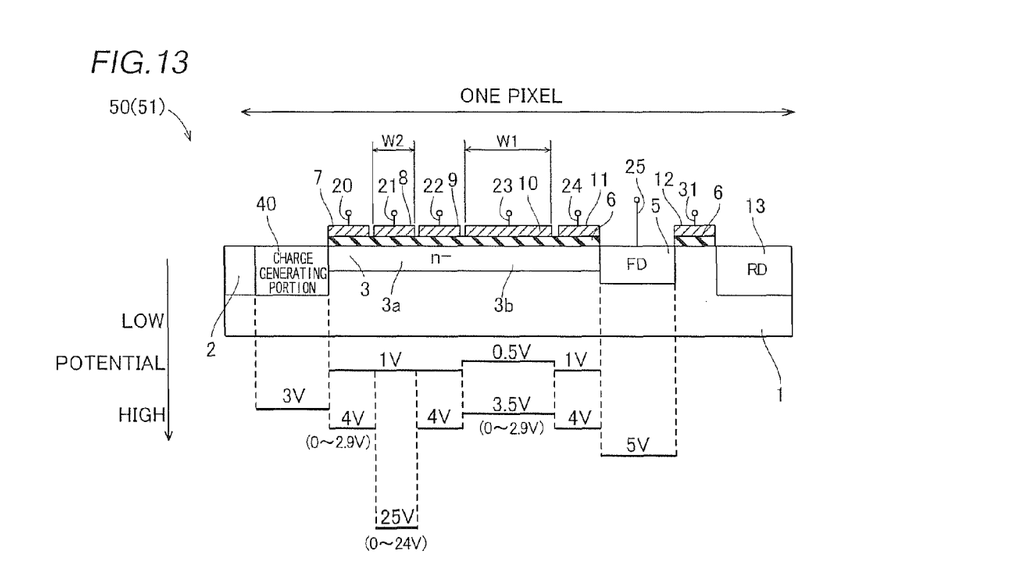
FIG. 13 is a diagram for illustrating a sensor unit as a modification of the first and second embodiments.

While each of the aforementioned first and second embodiments is applied to the CMOS image sensor employed as an exemplary image sensor, the present invention is not restricted to this but is also applicable to a sensor unit, other than the image sensor, performing sensing by generating electrons. For example, the CMOS image sensor according to each of the first and second embodiments can alternatively be driven as a sensor unit by arranging a charge generating portion 40 in place of the PD portion 4 as in another modification of the first embodiment shown in FIG. 13, to attain effects similar to those of the aforementioned first and second embodiments with this structure. This sensor unit can also multiply generated electrons (sensed data) by performing operations similar to those of the CMOS image sensors according to the aforementioned first and second embodiments.

What is claimed is:

1. An image sensor comprising:
   a charge storage portion for storing and transferring signal charges;
   a first electrode for forming an electric field storing the signal charges in said charge storage portion;
   a charge increasing portion for increasing the signal charges stored in said charge storage portion; and
   a second electrode for forming another electric field increasing the signal charges in said charge increasing portion, wherein
   the quantity of the signal charges storable in said charge storage portion has at least either of a structure that the plane area of said first electrode is larger than at least the plane area of said second electrode or a structure that the dielectric constant of a gate insulating film between said first electrode and said charge storage portion is at least larger than the dielectric constant of said gate insulating film between said second electrode and said charge increasing portion so that the quantity of the signal charges storable in said charge storage portion is not less than the quantity of the signal charges storable in said charge increasing portion, and wherein
   the signal charges are increased in said charge increasing portion due to impact ionization by the electric field formed from said second electrode.

2. The image sensor according to claim 1, wherein the plane area of said first electrode is larger than at least the plane area of said second electrode.

3. The image sensor according to claim 2, wherein
   a first voltage for forming the electric field storing the signal charges is applied to said first electrode and a second voltage for forming the electric field increasing the signal charges, larger than said first voltage is applied to said second electrode, and
   the plane area of said first electrode and the plane area of said second electrode are so set on the basis of the levels of said first voltage and said second voltage that the quantity of the signal charges storable in said charge storage portion is not less than the quantity of the signal charges storable in said charge increasing portion.

4. The image sensor according to claim 1, wherein
   the length of said first electrode along a transfer direction of the signal charges is larger than at least the length of said second electrode along the transfer direction of the signal charges.

5. The image sensor according to claim 4, wherein
   the length of said first electrode extending in a direction perpendicular to the transfer direction of the signal charges is substantially identical to at least the length of said second electrode extending in a direction perpendicular to the transfer direction of the signal charges in plan view.

6. The image sensor according to claim 1, wherein
   the length of said first electrode extending in a direction perpendicular to a transfer direction of the signal charges is larger than at least the length of said second electrode extending in a direction perpendicular to the transfer direction of the signal charges in plan view.

7. The image sensor according to claim 1, further comprising:
   a voltage conversion portion for converting the signal charges to a voltage;
   a third electrode for forming an electric field transferring the signal charges stored in said charge storage portion to said voltage conversion portion, provided between said first electrode and said voltage conversion portion; and
   a transfer channel provided below said first electrode, said second electrode and said third electrode, including said charge increasing portion and said charge storage portion and performing a signal charge transferring operation and a signal charge increasing operation, wherein
   the potential of said transfer channel corresponding to said third electrode in applying a voltage forming the electric field transferring the signal charges to said voltage conversion portion to said third electrode is larger than the potential of said charge storage portion included in said transfer channel corresponding to said first electrode in applying a voltage for forming the electric field storing the signal charges to said first electrode.

8. The image sensor according to claim 7, wherein
   said signal charge transferring operation from said charge storage portion to said voltage conversion portion is so controlled to be performed by applying the voltage for forming the electric field transferring the signal charges to said voltage conversion portion to said third electrode in a state of applying the voltage for forming the electric field storing the signal charges in said charge storage portion to said first electrode.

9. The image sensor according to claim 7, wherein
   the impurity concentration of a region of said transfer channel corresponding to said first electrode is smaller than at least the impurity concentration of a region corresponding to said third electrode.

10. The image sensor according to claim 1, further comprising a fourth electrode provided between said first electrode and said second electrode and forming an electric field for transferring the signal charges, wherein a signal charge increasing operation is performed by transferring the signal charges from said charge storage portion to said charge increasing portion in a state of applying a voltage forming the electric field transferring the signal charges to said fourth electrode.

11. The image sensor according to claim 10, wherein said signal charge increasing operation is performed by applying a voltage for forming the electric field increasing the signal charges in said charge increasing portion to said second electrode and thereafter applying the voltage for forming the electric field transferring the signal charges to said fourth electrode in a state of applying a voltage for forming the electric field storing the signal charges in said charge storage portion to said first electrode.

12. The image sensor according to claim 1, wherein a signal charge increasing operation by transferring the signal charges from said charge storage portion to said charge increasing portion and a signal charge transferring operation from said charge increasing portion to said charge storage portion are alternately repeatedly performed.

13. The image sensor according to claim 1, further comprising:

a voltage conversion portion for converting the signal charges to a voltage;

a photoelectric conversion portion generating the signal charges;

a third electrode for forming an electric field transferring the signal charges stored in said charge storage portion to said voltage conversion portion, provided between said first electrode and said voltage conversion portion, a fourth electrode provided between said first electrode and said second electrode, and forming an electric field for transferring the signal charges; and a fifth electrode for transferring the signal charges, provided between said photoelectric conversion portion and said second electrode.

14. The image sensor according to claim 13, wherein the plane areas of said second electrode, said third electrode, said fourth electrode and said fifth electrode are substantially identical to each other, and the plane area of said first electrode is larger than each of the plane areas of said second electrode, said third electrode, said fourth electrode and said fifth electrode.

* * * * *